US010284696B2

(12) United States Patent
Li et al.

(10) Patent No.: US 10,284,696 B2
(45) Date of Patent: May 7, 2019

(54) SHELL, METHOD FOR MANUFACTURING THE SAME AND MOBILE TERMINAL HAVING THE SAME

(71) Applicant: GUANGDONG OPPO MOBILE TELECOMMUNICATIONS CORP., LTD., Dongguan (CN)

(72) Inventors: Jing Li, Dongguan (CN); Bin Ji, Dongguan (CN); Yucai Yuan, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/671,487

(22) Filed: Aug. 8, 2017

(65) Prior Publication Data
US 2018/0069951 A1 Mar. 8, 2018

(30) Foreign Application Priority Data

Sep. 8, 2016 (CN) .......................... 2016 1 0812276
Sep. 8, 2016 (CN) ...................... 2016 2 1044640 U (51) Int. Cl.
*H04M 1/02* (2006.01)
*B32B 7/12* (2006.01)
(Continued)

(52) U.S. Cl.
CPC .............. *H04M 1/026* (2013.01); *B32B 7/12* (2013.01); *B32B 27/06* (2013.01); *G06F 1/1656* (2013.01);
(Continued)

(58) Field of Classification Search
CPC .. H04M 1/0249; H04M 1/026; H04M 1/0202; H04M 1/0283; H05K 5/02;
(Continued)

(56) References Cited

U.S. PATENT DOCUMENTS 7,947,900 B2 * 5/2011 Cheng .................... B32B 15/01
174/50
8,618,415 B2 * 12/2013 Wennemer ............. B29C 43/02
150/154
(Continued)

FOREIGN PATENT DOCUMENTS

CN 102285298 A 12/2011
CN 102605371 A * 7/2012
(Continued)

OTHER PUBLICATIONS

PCT/CN2017/097566 International Search Report & Written Opinion dated Nov. 3, 2017, 12 pages.
(Continued)

*Primary Examiner* — Pablo N Tran
(74) *Attorney, Agent, or Firm* — Lathrop Gage LLP (57) ABSTRACT

A shell is provided. The shell includes a metallic body, a non-metallic layer and a coating layer. The non-metallic layer is configured to connect at least two parts of the metallic body, and the coating layer is provided on an outer surface of the non-metallic layer, and exhibits a consistent color with an outer surface of the metallic body. A method for manufacturing the shell and the mobile terminal including the shell are also provided.

20 Claims, 13 Drawing Sheets (51) Int. Cl.
  *B32B 27/06* (2006.01)
  *G06F 1/16* (2006.01)
  *H05K 5/02* (2006.01)
  *C09D 11/328* (2014.01)

(52) U.S. Cl.
  CPC .......... *H04M 1/02* (2013.01); *H04M 1/0202* (2013.01); *H04M 1/0283* (2013.01); *H05K 5/0243* (2013.01); *C09D 11/328* (2013.01)

(58) Field of Classification Search
  CPC ........ H05K 5/04; H05K 5/0243; B32B 27/06; B32B 37/12; B32B 38/145; B32B 2309/105; B32B 7/12; G06F 1/1656; C09D 11/328
  See application file for complete search history.

(56) References Cited

U.S. PATENT DOCUMENTS

| | | | | |
|---|---|---|---|---|
| 8,772,650 | B2 * | 7/2014 | Merz | G06F 1/1656 174/520 |
| 9,834,851 | B2 * | 12/2017 | Lai | C25D 11/10 |
| 9,962,788 | B2 * | 5/2018 | Scott | B41M 5/262 |
| 2009/0239068 | A1 | 9/2009 | Shi et al. | |
| 2010/0097276 | A1 * | 4/2010 | Lin | B44C 5/0453 343/702 |
| 2011/0151212 | A1 | 6/2011 | Liu et al. | |
| 2012/0052773 | A1 * | 3/2012 | Mase | B24C 1/04 451/38 |
| 2013/0280550 | A1 * | 10/2013 | Huang | B29C 45/14344 428/626 |

FOREIGN PATENT DOCUMENTS

| | | | |
|---|---|---|---|
| CN | 102616070 | A * | 8/2012 |
| CN | 103379753 | A | 10/2013 |
| CN | 106572212 | A | 4/2014 |
| CN | 104710868 | A | 6/2015 |
| CN | 105007342 | A | 10/2015 |
| CN | 105517389 | A | 4/2016 |
| CN | 105682395 | A | 6/2016 |
| CN | 105813422 | A | 7/2016 |
| CN | 106572208 | A | 4/2017 |
| CN | 106572211 | A | 4/2017 |
| CN | 206353801 | U | 7/2017 |
| CN | 107809499 | A | 3/2018 |
| JP | WO 2014061523 | A1 * | 4/2014 |
| WO | WO 2015152632 | A1 | 10/2015 |

OTHER PUBLICATIONS

European Patent Application No. 17185603.2 Extended Search and Opinion dated Oct. 25, 2017, 6 pages.
Database WPI, Week 201609, Thomson Scientific, London, GB; AN 2016-071223 & CN 204 993 518 U (Boluo Dongming Chem Co L To) Jan. 20, 2016 (Jan. 20, 2016), 1 page.
Database WPI, Week 201646, Thomson Scientific, London, GB;AN 2016-369043 & CN 105 657 101 A (Guangdong OPPO Mobile Communication Col) Jun. 8, 2016 (Jun. 8, 2016), 2 pages.
Chinese Patent Application No. 201610958424.8 English translation of First Office Action dated Oct. 23, 2018, 13 pages.
Chinese Patent Application No. 201610958424.8 First Office Action dated Oct. 23, 2018, 11 pages.
Chinese Patent Application No. 201610973678.7 English translation of First Office Action dated Oct. 9, 2018, 15 pages.
Chinese Patent Application No. 201610973678.7 First Office Action dated Oct. 9, 2018, 14 pages.

* cited by examiner

SHELL, METHOD FOR MANUFACTURING THE SAME AND MOBILE TERMINAL HAVING THE SAME

CROSS-REFERENCE TO RELATED APPLICATIONS

This application claims priority to and benefits of Chinese Patent Application Serial No. 201610812276.9 and No. 201621044640.3, both filed with the State Intellectual Property Office of P. R. China on Sep. 8, 2016, the entire contents of which are incorporated herein by reference.

FIELD

The present disclosure relates to the technology field of communication, and more particularly to a shell, a method for manufacturing the shell and a mobile terminal having the shell.

BACKGROUND

With the widespread application of a metallic shell of a mobile phone, the requirement on the appearance of the shell is improved increasingly, and integrity of the appearance of the shell is preferred by more people. However, most of the current mobile phones are limited by the communication function or limited by the processing technology, resulting in the existences of both a metallic portion and a non-metallic portion in the shell. The non-metallic portion is made of a material different from that of the metallic portion, and thus exhibits a different colour from the metallic portion, resulting in a less preferred integral appearance of the shell of the mobile phone and an unsatisfied user experience.

SUMMARY

In embodiments of the present disclosure, a shell and a mobile terminal are provided which may improve the experience of the user.

In an embodiment of the present disclosure, a shell is provided. The shell includes a metallic body, a non-metallic layer and a coating layer. The non-metallic layer is configured to connect at least two parts of the metallic body. The coating layer is provided on an outer surface of the non-metallic layer, and exhibits a consistent colour with an outer surface of the metallic body.

In an embodiment of the present disclosure, a method for manufacturing a shell is provided. The method includes:

providing a workpiece including a metallic body and a non-metallic layer;

providing a coating layer on an outer surface of the non-metallic layer, the coating layer exhibiting a consistent colour with an outer surface of the metallic body.

In an embodiment of the present disclosure, a mobile terminal is provided. The mobile terminal includes a shell described above, a mainboard fixed in the shell, and a functional component disposed on the mainboard.

With the shell, the method for manufacturing the shell and the mobile terminal including the shell according to embodiments of the present disclosure, the coating layer is provided on the outer surface of the non-metallic layer and exhibits a consistent colour with the outer surface of the metallic body, and thus the overall shell has a consistent appearance.

BRIEF DESCRIPTION OF THE DRAWINGS

These and other aspects and advantages of the disclosure will become apparent and more readily appreciated from the following descriptions taken in conjunction with the drawings as described below.

DETAILED DESCRIPTION

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure. In addition, for ease of description, the accompanying drawings only show components related to the present disclosure, not all the structure.

Figure 1:
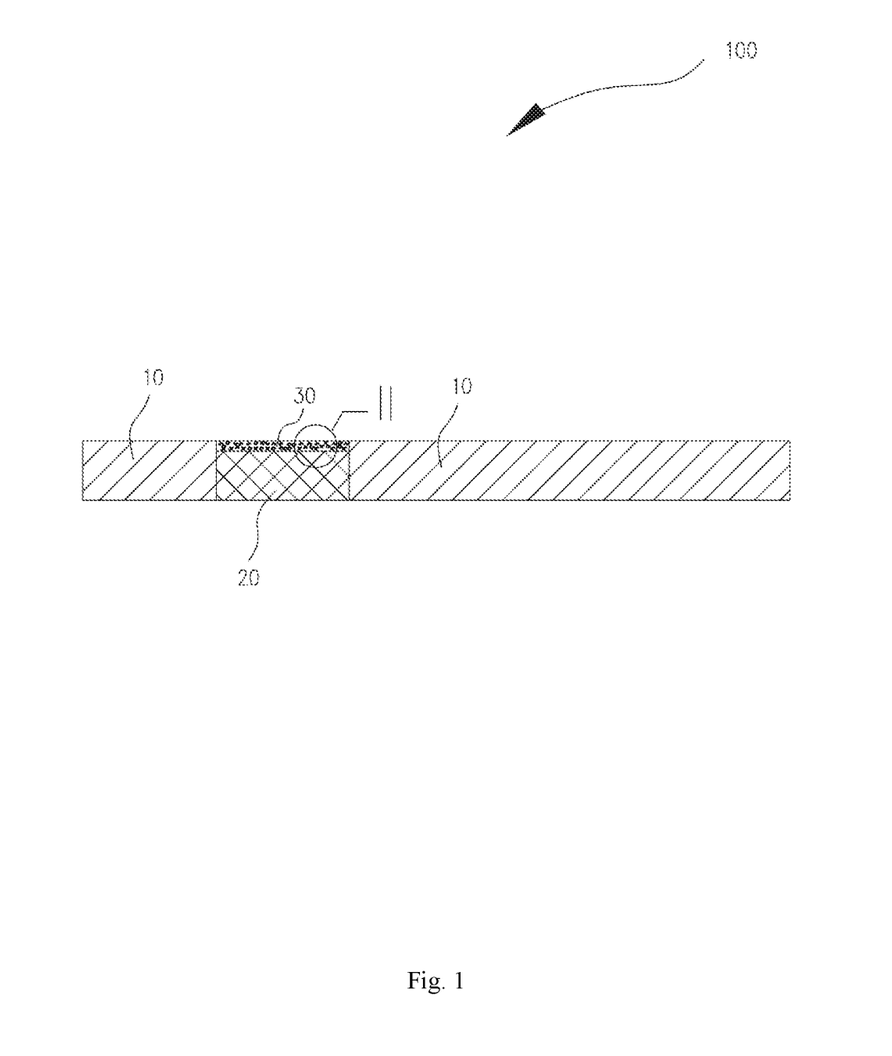
FIG. 1 is a schematic view of a shell according to an embodiment of the present disclosure.
Figure 2:
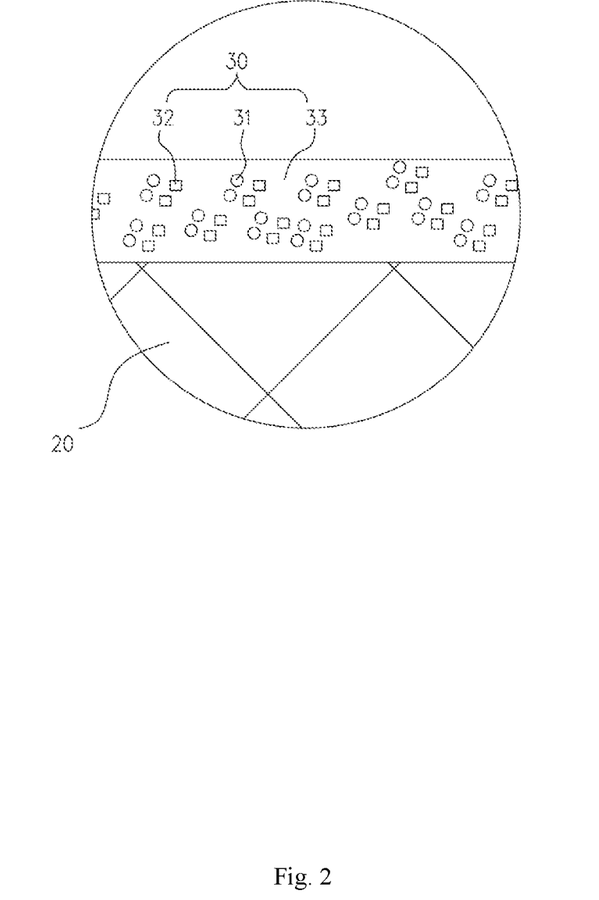
FIG. 2 is a schematic enlarged view of part II of the shell in FIG. 1.

As shown in FIG. 1 and FIG. 2, a shell 100 is provided according to an embodiment of the present disclosure. The shell 100 includes a metallic body 10, a non-metallic layer 20 configured to connect at least two parts of the metallic body 10, and a coating layer 30 provided on an outer surface of the non-metallic layer 20 and exhibiting a consistent colour with an outer surface of the metallic body 10. It will be appreciated that, the shell 100 may be a shell of a mobile terminal 200, such as a mobile phone, a tablet computer, a notebook computer and the like.

As the coating layer 30 is provided on the outer surface of the non-metallic layer 20 and exhibits a consistent colour with the outer surface of the metallic body 10, the integral appearance of shell 100 is consistent and thus the user experience is improved.

In an embodiment of the present disclosure, the shell 100 is plate-like. The non-metallic layer 20 is fixed at an end of the metallic body 10. The non-metallic layer 20 may be distributed in the shell 100 in a predetermined shape. Specifically, as shown in FIG. 1, the non-metallic layer 20 may be formed in an integral slot of the shell 100, and the metallic body 10 is formed as two metallic parts spaced apart from each other by the non-metallic layer 20. The metallic body 10 may be formed by cutting an integral metallic plate into two metallic parts. The non-metallic layer 20 may be fixed between the two metallic parts by injecting or bonding process. In order to improve the integral metallic texture of the shell 100, an area of the non-metallic layer 20 is less than that of the metallic body 10. Alternatively, in other embodiments, the area of the non-metallic layer 20 may be the same as that of the metallic body 10, or bigger than that of the metallic body 10. The non-metallic layer 20 may also be distributed in the shell 100 in a shape of a circle, a triangle or a random curve.

In an embodiment of the present disclosure, the coating layer 30 includes a mixture. The coating layer 30 is uniformly laid on the outer surface, facing to a user, of the non-metallic layer 20. An orthographical projection of the coating layer 30 on the non-metallic layer 20 coincides with the outer surface of the non-metallic layer 20, and thus the coating layer 30 perfectly covers the non-metallic layer 20, i.e., the non-metallic layer 20 is concealed under the coating layer 30. By covering the non-metallic layer 20 perfectly with the coating layer 30, only the metallic body 10 and the coating layer 30 can be observed by the user. As the coating layer 30 exhibits a consistent colour with the outer surface of the metallic body 10, the overall shell 100 has a consistent appearance and thus the user experience is improved. It will be appreciated that, the expression that "the coating layer 30 exhibits a consistent colour with the outer surface of the metallic body 10" means that the colour appearance of the coating layer 30 directly observed by a user is substantially the same as or the same as the colour appearance of the outer surface of the metallic body 10 facing to the user, i.e., the coating layer 30 exhibits substantially the same or the same visual colour as the outer surface of the metallic body 10. Alternatively, in another embodiment of the present disclosure, the area covered by the coating layer 30 may bigger than the area of the outer surface of the non-metallic layer 20.

In a further embodiment of the present disclosure, the coating layer 30 includes ink 33 containing metal particles 31 and pigments 32. In an embodiment of the present disclosure, metal particles 31 are mixed in the ink 33, and thus the coating layer 30 exhibits substantially the same metallic appearance as the metallic body 10. Furthermore, the pigments 32 are mixed in the ink 33, and thus the integral colour of the coating layer 30 is improved.

Therefore, the coating layer 30 exhibits the consistent appearance colour with the metallic body 10. The ink 33 present in the coating layer 30 as a major component facilitates formation of the coating layer 30 on the non-metallic layer 20, that is, the area covered by the coating layer 30 may be controlled precisely, thus improving the appearance of the shell 100. It should be appreciated that the coating layer 30 may be formed on the non-metallic layer 20 by a spraying process, a screen printing process or an exposure and development process. The metal particles 31 and the pigments 32 may be mixed into the ink 33 with a predetermined ratio. The metal particle 31 may be at least one of aluminum, silver, iron, titanium, magnesium, and any alloy thereof. For example, the metal particles 31 may be aluminum powders, silver powders, titanium powders, aluminum alloy powders, titanium alloy powders, magnalium alloy powders, or titanium magnesium alloy powders. In an embodiment of the present disclosure, the metal particles 31 may be stainless steel particles.

Figure 3:
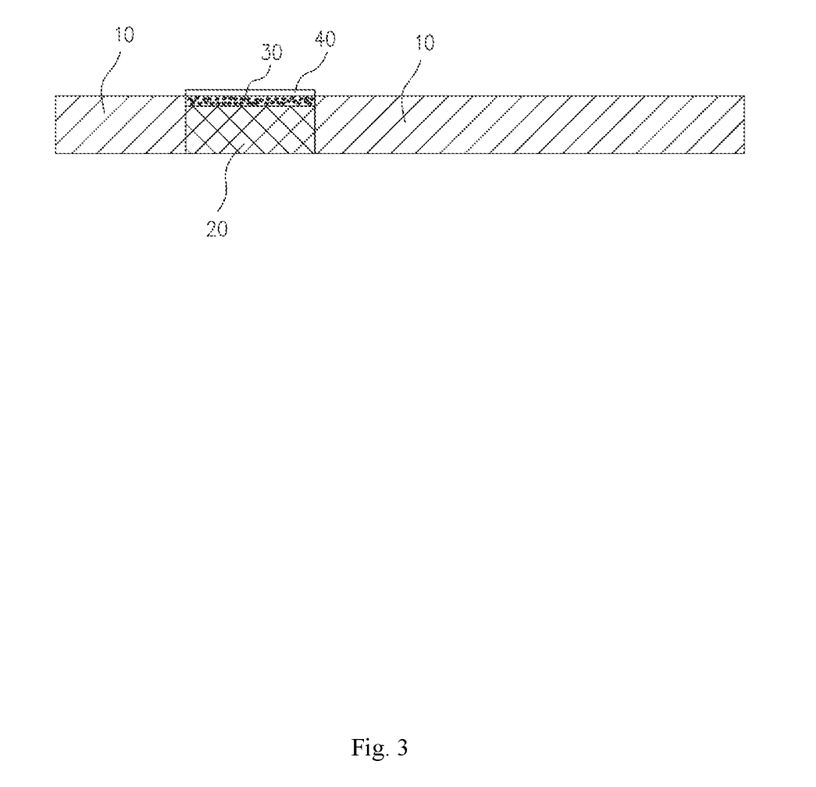
FIG. 3 is a schematic view of the shell in FIG. 1.

In a further embodiment of the present disclosure, as shown in FIG. 3, an ink protecting layer 40 is provided on the outer surface of the coating layer 30.

In such an embodiment, the ink protecting layer 40 includes ink and is transparent, and thus the colour of the coating layer 30 is able to be observed through the ink protecting layer 40, thereby preventing the ink protecting layer 40 from affecting the appearance of the coating layer 30, i.e., guaranteeing the integral appearance of the shell 100. The ink protecting layer 40 has a high surface tension, thus exhibiting good performances such as abrasion resistance, corrosion resistance and exfoliation resistance. In the shell 100, the coating layer 30 and the ink protecting layer 40 are provided on the non-metallic layer 20. An orthographical projection of the ink protecting layer 40 on the coating layer 30 coincides with the coating layer 30, and thus the ink protecting layer 40 may be arranged on the coating layer 30 precisely, so as to guarantee the functions of the appearance of the shell 100, prevent the coating layer 30 from being scratched, peeled off or corroded, and reduce the cost. In other embodiments of the present disclosure, a plurality of the coating layers 30 or/and a plurality of the ink protecting layers 40 are laminated on the non-metallic layer 20, and thus the colour corresponding to the non-metallic layer 20 of the shell 100 is purer and a protection of the appearance is more improved.

In an embodiment of the present disclosure, the ink protecting layer 40 includes ink with sandblasting resistance.

In this embodiment, in order to guarantee the integral flatness of the shell 100 and allow the surface of the shell 100 to obtain a certain degree of cleanliness and different roughness, the outer surface of the metallic body 10 is subjected to sandblasting, thus improving mechanical performances, including fatigue resistance, of the outer surface of the shell 100. If the ink protecting layer 40 is provided on the coating layer 30 before subjecting the metallic body 10 to the sandblasting, the ink of the ink protecting layer 40 may be the ink with sandblasting resistance, thereby avoiding the ink protecting layer 40 to be damaged when the metallic body 10 is subjected to sandblasting, and thus avoiding the appearance and structure of the shell 100 to be affected. Alternatively, in other embodiments of the present disclosure, the coating layer 30 may also include the ink with sandblasting resistance, thus further improving the appearance and structure of the shell 100.

Figure 4:
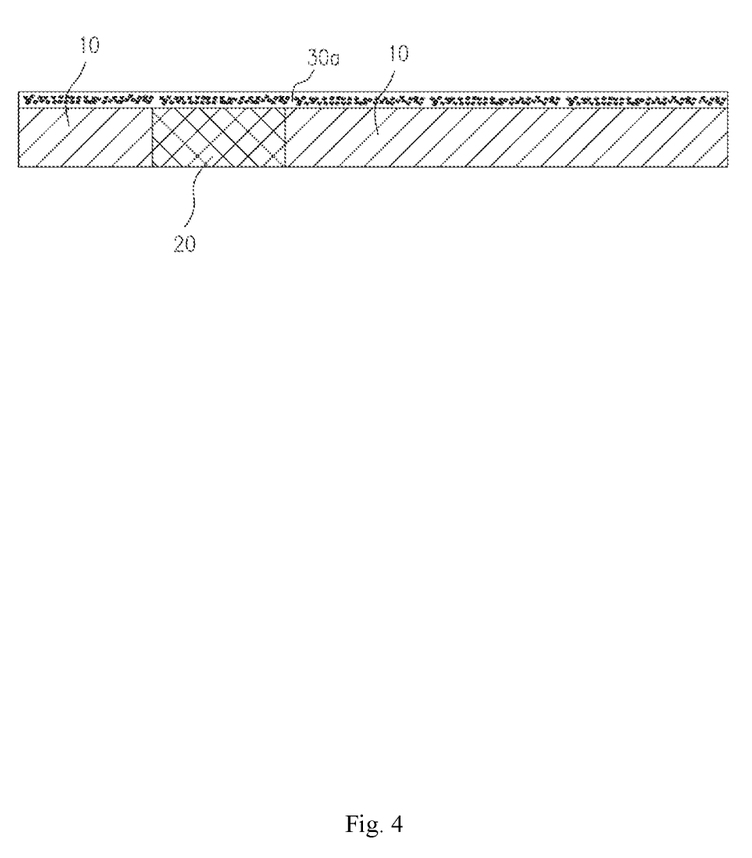
FIG. 4 is a schematic view showing the manufacture of a shell according to an embodiment of the present disclosure.
Figure 5:
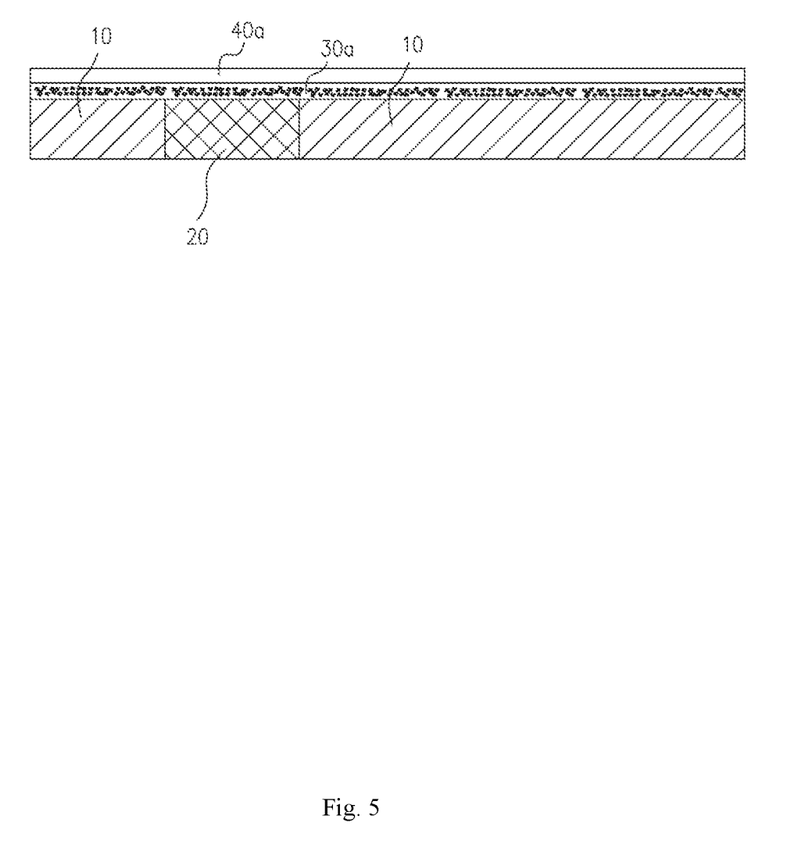
FIG. 5 is a schematic view showing the manufacture of a shell according to an embodiment of the present disclosure.
Figure 6:
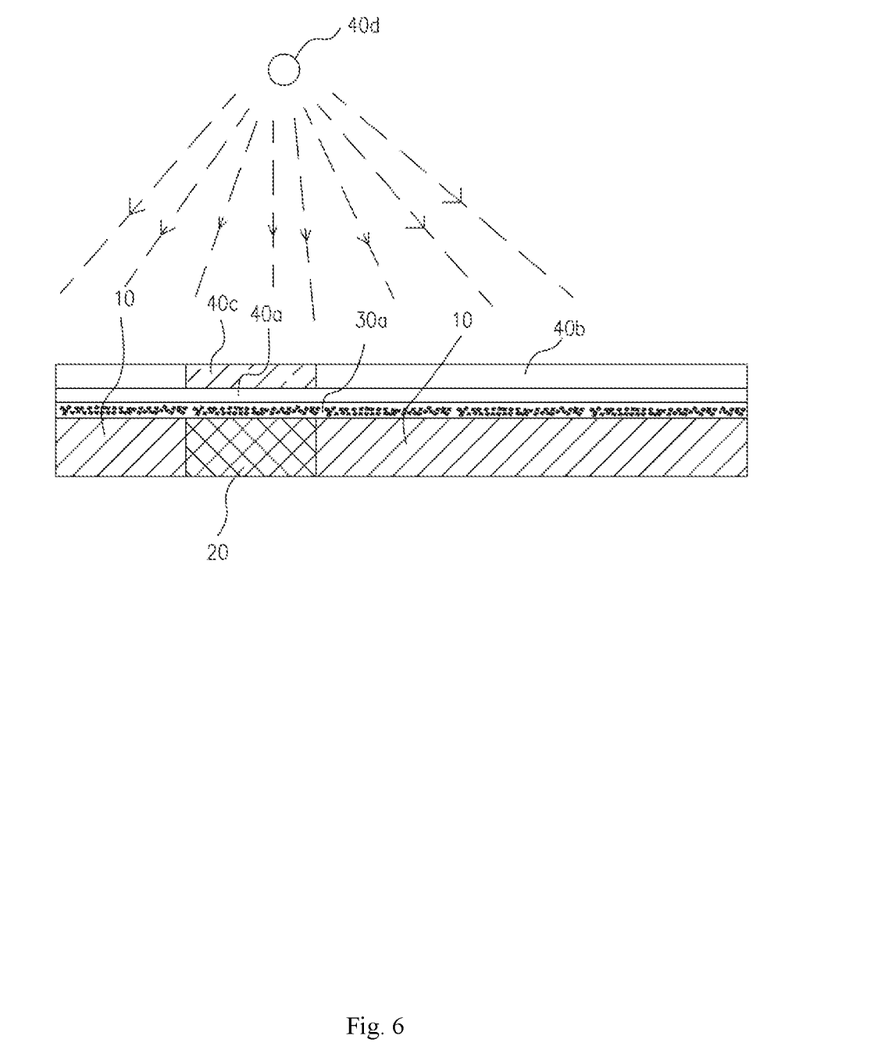
FIG. 6 is a schematic view showing the manufacture of a shell according to an embodiment of the present disclosure.
Figure 7:
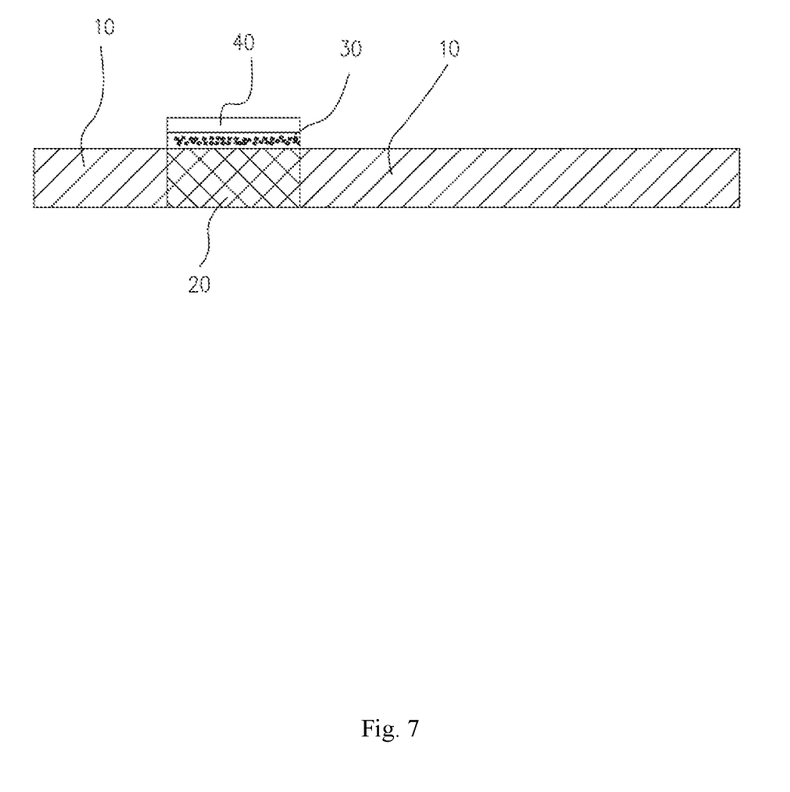
FIG. 7 is a schematic view showing the manufacture of a shell according to an embodiment of the present disclosure.

In an embodiment of the present disclosure, the ink used both in the coating layer 30 and the ink protecting layer 40 is exposure ink. In the present embodiment, the coating layer 30 and the ink protecting layer 40 are formed on the non-metallic layer 20 by a process of exposure and development. Specifically, firstly, as shown in FIG. 4, a layer of colouring ink 30*a* is provided on outer surfaces of the metallic body 10 and the non-metallic layer 20, and the colouring ink 30*a* is heated at 70° C. for 20 min. Secondly, protecting ink 40*a* is provided on the heated colouring ink 30*a*, as shown in FIG. 5. Thirdly, as shown in FIG. 6, a film 40*b*, including a preset exposure area 40*c* coinciding with the non-metallic layer 20, is attached to the protecting ink 40*a*, when the film 40*b* is irradiated by a light source 40*d*, parts of the protecting ink 40*a* and the colouring ink 30*a* corresponding to the exposure area 40*c* are photopolymerized, however, parts of the protecting ink 40*a* and the colouring ink 30*a* corresponding to the metallic body 10 are not reacted. Fourthly, as shown in FIG. 7, unreacted protecting ink 40a and unreacted colouring ink 30a are corroded with an alkali liquor, remaining the protecting ink 40a and the colouring ink 30a corresponding to the exposure area 40c on the non-metallic layer 20. Lastly, the protecting ink 40a and the colouring ink 30a remaining on the non-metallic layer 20 are solidified by heating the same at 180° C., and thus the protecting ink 40a remaining on the non-metallic layer 20 is formed as the ink protecting layer 40 and the colouring ink 30a remaining on the non-metallic layer 20 is formed as the coating layer 30.

In an embodiment of the present disclosure, the outer surface of the ink protecting layer 40 is a matte surface. In the present disclosure, since the outer surface of the metallic body 10 is subjected to sandblasting, a plurality of dimples are formed at the outer surface of the metallic body 10, that is, the outer surface of the metallic body 10 may exhibit diffuse reflection. In order to make the shell 100 have the consistent appearance at the non-metallic layer 20 with that at the metallic body 10, the outer surface of the ink protecting layer 40 is subjected to a matte process, and thus a plurality of dimples may also be formed at the outer surface of the ink protecting layer 40, that is, the outer surface of the ink protecting layer 40 may also exhibit diffuse reflection.

In another embodiment of the present disclosure, the non-metallic layer 20 is configured to form a clearance area for an antenna of the shell 100.

In the present embodiment, the area of the metallic body 10 is bigger than that of the non-metallic layer 20. When the shell 100 is applied in a mobile terminal 200, the antenna inside the mobile terminal 200 is required to send electromagnetic signals through the shell 100. The metallic body 10 inevitably shields the electromagnetic signals of the antenna because of its metallic characters, and thus it is necessary to provide the non-metallic layer 20, the coating layer 30 and the ink protecting layer 40 arranged on the non-metallic layer 20 to be used as the clearance area for the antenna, so as to improve the irradiation of the antenna. Specifically, the non-metallic layer 20 includes a non-signal-shielding material. In an embodiment of the present disclosure, the material of the non-metallic layer 20 is plastics, alternatively, it may also be carbon fibers, organic resins or glass fibers.

Figure 8:
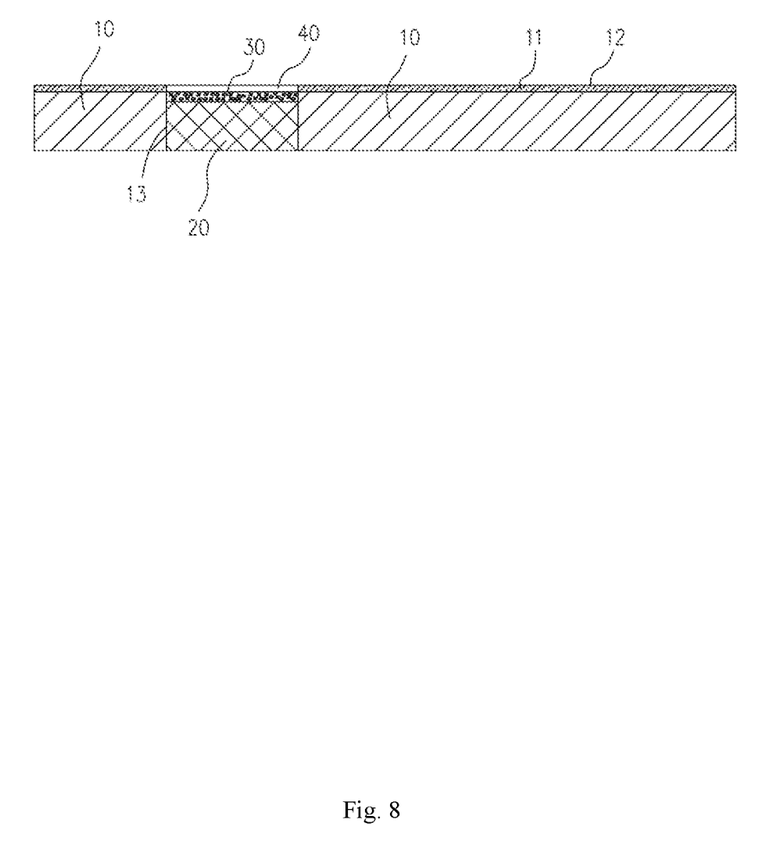
FIG. 8 is a schematic view of a shell according to an embodiment of the present disclosure.

In an embodiment of the present disclosure, as shown in FIG. 8, an anodic oxidation layer 11 is provided on the outer surface of the metallic body 10, and exhibits a consistent colour with the coating layer 30.

In the present embodiment, in order to obtain the needed colour of the metallic body 10, the outer surface of the metallic body 10 is coloured by subjecting the outer surface of the metallic body 10 to an anodic oxidation treatment, thus obtaining the predetermined colour of the outer surface of the metallic body 10. Alternatively, in other embodiments, the predetermined colour of the outer surface of the metallic layer 10 may be realized by an electroplating or corroding process.

In an embodiment of the present disclosure, an outer surface of the anodic oxidation layer 11 is a sandblasted surface 12. In the present embodiment, after the anodic oxidation layer 11 is formed on the outer surface of the metallic layer 10, the anodic oxidation layer 11 is subjected to sandblasting, and thus the outer surface of the anodic oxidation layer 11 is the sandblasted surface 12. Moreover, the anodic oxidation layer 11 is formed integrally with the metallic body 10, thus enhancing adhesive force between the anodic oxidation layer 11 and the metallic body 10 to avoid the negative effect of the exfoliation of the anodic oxidation layer 11 on the appearance of the shell 100. In other words, the anodic oxidation layer 11 is formed by oxidizing the metal of the metallic body 10, and the metallic body 10 may include a material selected from aluminum, silver, stainless steel, aluminium alloy, titanium alloy, magnesium alloy and magnalium alloy. Specifically, the anodic oxidation layer 11 is subjected to sandblasting before or after the ink protecting layer 40 is formed on the coating layer 30.

In an embodiment of the present disclosure, the non-metallic layer 20 and the metallic body 10 are formed integrally.

In the present embodiment, the non-metallic layer 20 is formed integrally with the metallic body 10 by a nano-injection process. Specifically, a side 13 of the metallic body 10 is nanocrystallized, subsequently, the raw material of non-metallic layer 20 is ejected and formed on the side 13 of the metallic body 10, and thus the metallic body 10 and the non-metallic layer 20 may be formed integrally and bonded effectively and solidly.

Figure 9:
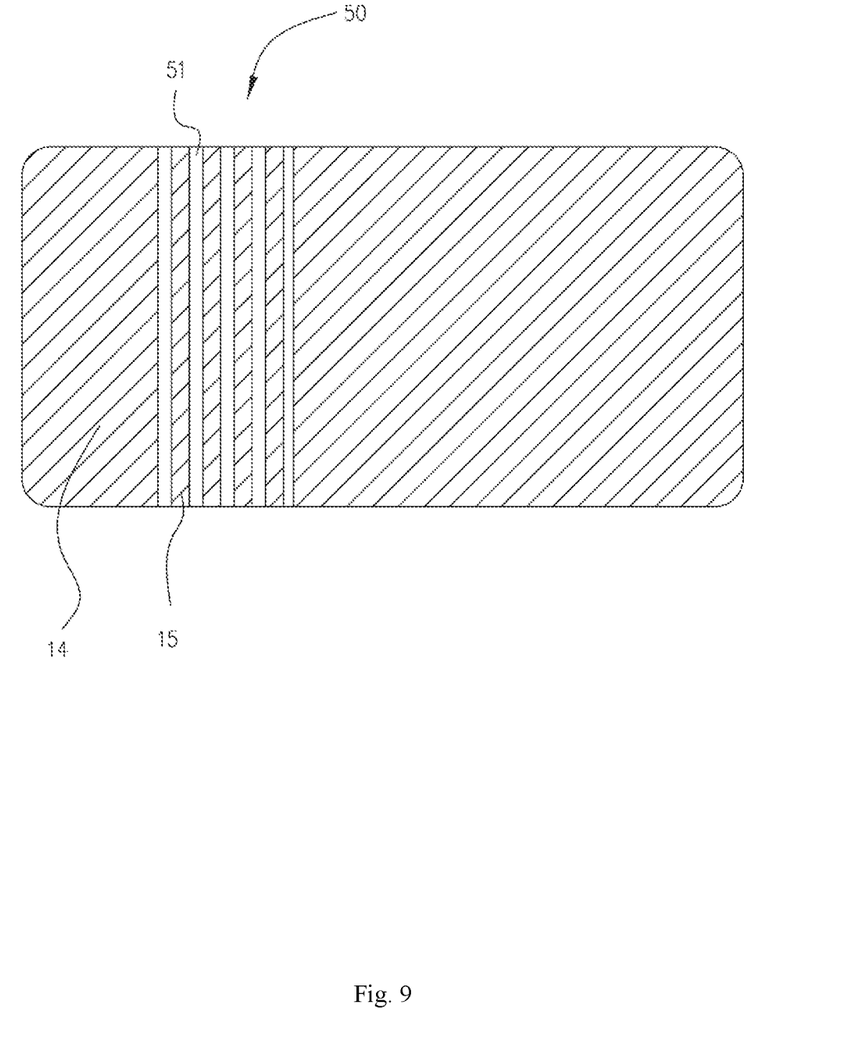
FIG. 9 is a top view of the shell in FIG. 8.
Figure 10:
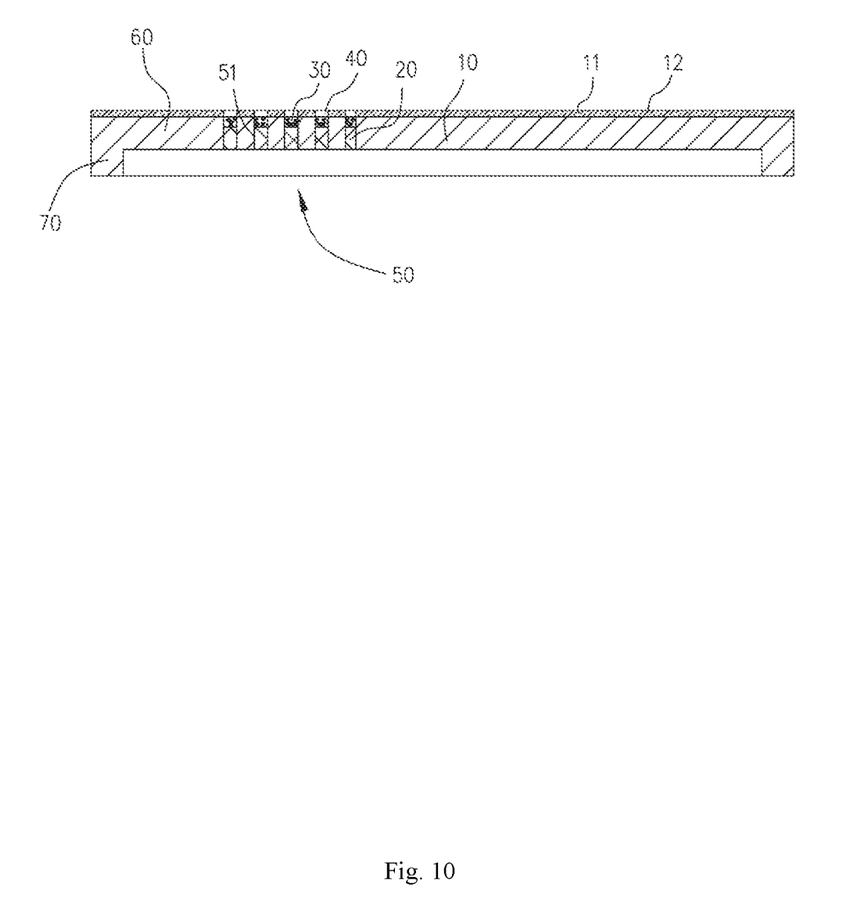
FIG. 10 is a schematic view of a shell according to an embodiment of the present disclosure.

In an embodiment of the present disclosure, as shown in FIGS. 9 and 10, the non-metallic layer 20 is formed as at least one ultra-fine strap 50 of the shell 100. The ultra-fine strap 50 has a plurality of slots 51 spaced apart from each other. The metallic body 10 includes at least two metal plates 14 and a plurality of metal straps 15 separated by the plurality of slots 51.

In the present disclosure, the ultra-fine strap 50 straightly extends in a width direction of the shell 100. In an embodiment of the present disclosure, one ultra-fine strap 50 is formed in the shell 100, such that the metallic body 10 includes two metal plates 14 and a plurality of the metal straps 15. As the ultra-fine strap 50 has a plurality of slots 51, the non-metallic layer 20 is filled in the slots 51 of the ultra-fine strap 50 and the coating layer 30 is applied on the non-metallic layer 20, and therefore there is little or even no visual difference between the colour of the coating layer 30 and the ink protecting layer 40 applied at the slot 51 and the colour of the metallic body 10, thus improving the appearance of the shell 100. Specifically, a width L of the slot 51 is 0.2 mm to 3.0 mm. The non-metallic layer 20 formed as the ultra-fine strap 50 has a large area, thus improving the clearance area for an antenna of the shell 100, resulting in improved electromagnetic radiation of the shell 100. In other embodiments of the present disclosure, the ultra-fine strap 50 may also extend in a length direction of the shell 100, and two ultra-fine straps 50 may be provided on the shell 100. In an embodiment of the present disclosure, as shown in FIG. 10, the shell 100 includes a back cover 60 and a frame 70 integrally formed with the back cover 60 and formed at a bent peripheral edge of the back cover 60.

In the present embodiment, the shell 100 is used as a rear cover of the mobile terminal 200. A battery, the mainboard and other functional components are supported inside the shell 100. Specifically, the back cover 60 is a rectangular plate, and the frame 70 is bent at the peripheral edge of the back cover 60. The frame 70 and the back cover 60 may be formed integrally by milling with a numerical control (CN) milling machine, and the at least two parts of the metallic body 10 is separated by the non-metallic layer 20. In other embodiments of the present disclosure, the frame 70 and the back cover 60 may also be formed separately and assembled together.

Figure 11:
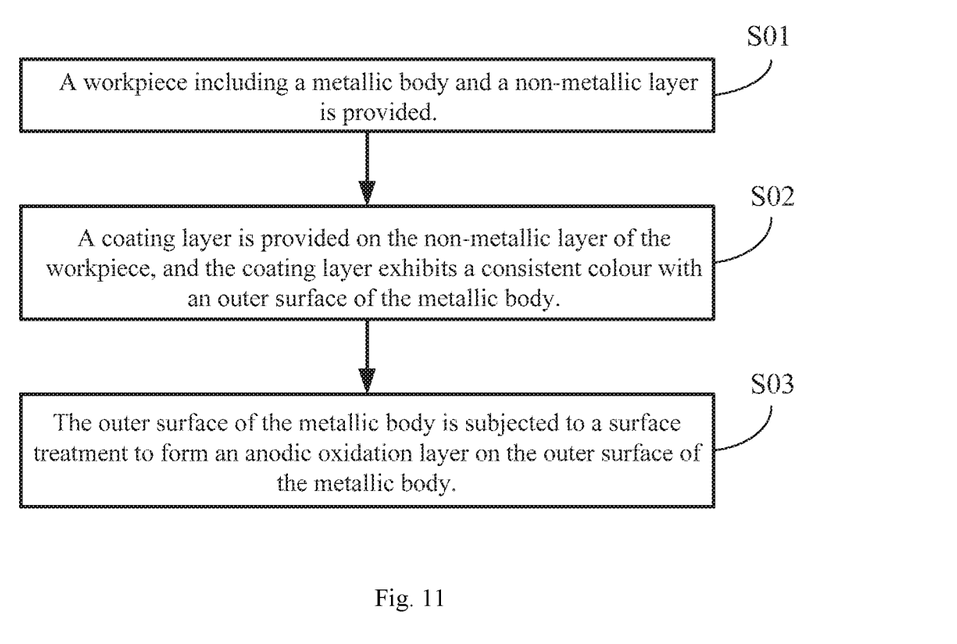
FIG. 11 is a block diagram of a method for manufacturing a shell according to an embodiment of the present disclosure.

In an embodiment of the present disclosure, as shown in FIG. 11, a method for manufacturing a shell is further provided in embodiments of the present disclosure. The shell 100 may be prepared by the method. The method includes the following steps.

Figure 12:
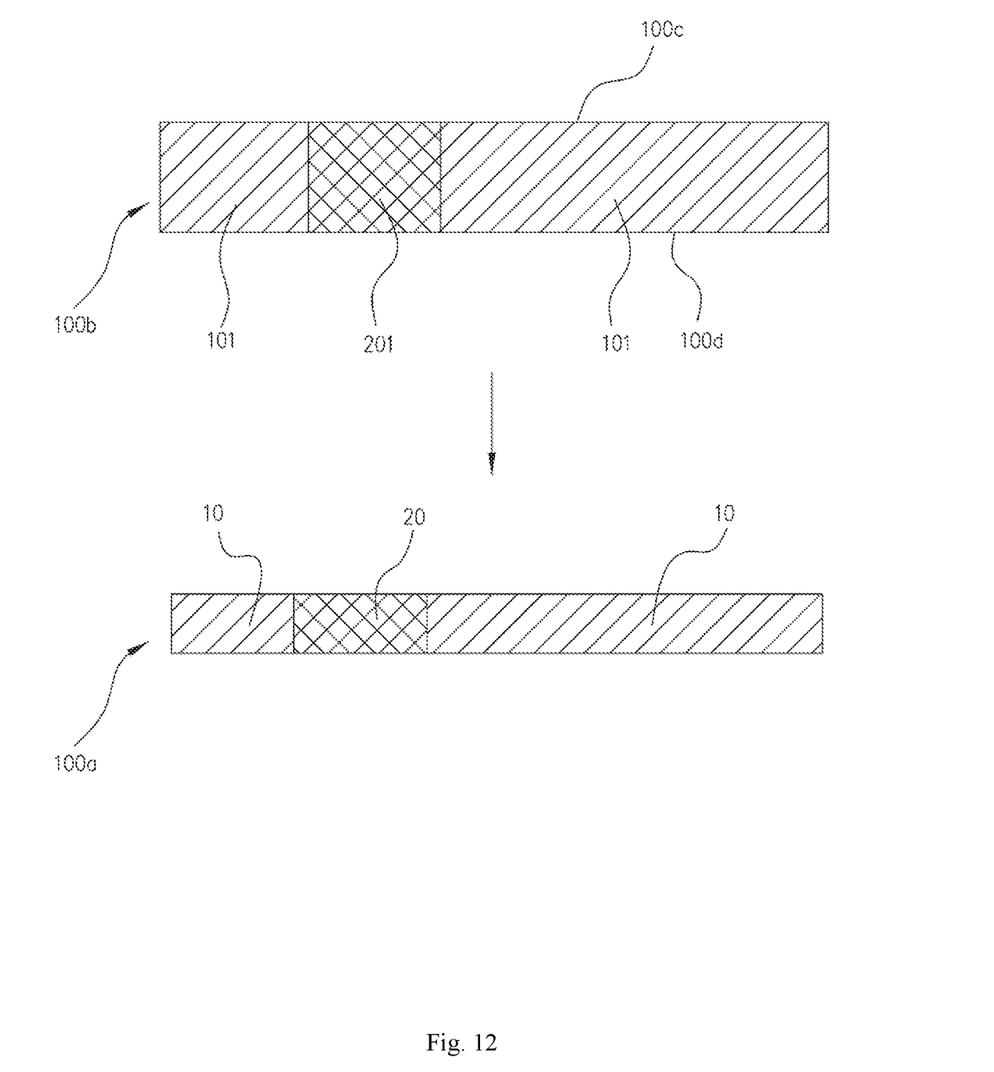
FIG. 12 is a schematic view showing the manufacture of a shell according to an embodiment of the present disclosure.

At block S01: a workpiece 100a (as shown in FIG. 12) including a metallic body 10 (as shown in FIG. 12) and a non-metallic layer 20 (as shown in FIG. 12) is provided.

In the present embodiment, the non-metallic layer 20 and the metallic body 10 are integrally formed by a nano-injection process into the workpiece 100a. Specifically, a metallic piece 101 (as shown in FIG. 12) and a non-metallic piece 201 (as shown in FIG. 12) are firstly provided and formed into a plate 100b (as shown in FIG. 12) by forming the non-metallic piece 201 on the metallic piece 101 with the nano-injection process. Secondly, an upper surface 100c (as shown in FIG. 12) and lower surface 100d (as shown in FIG. 12) of the plate 100b are milled, that is, the metallic piece 101 and the non-metallic piece 201 are subjected to numerical control milling together, and thus the metallic body 10 is formed from the metallic piece 101 and the non-metallic layer 20 is formed from the non-metallic piece 201, and the obtained workpiece 100a has an appearance surface in a specific size. Lastly, the metallic body 10 and the non-metallic layer 20 are subjected to a surface treatment to smooth the workpiece 100a and improve the adhesive force and fatigue resistance of the workpiece 100a. In a specific embodiment of the present disclosure, the surface treatment applied to the metallic body 10 and the non-metallic layer 20 may be first polishing and then sandblasting. Alternatively, the metallic body 10 and the non-metallic layer 20 may be polished only.

At block S02: a coating layer 30 is provided on the non-metallic layer 20 of the workpiece 100a (as shown in FIG. 3), and the coating layer 30 exhibits a consistent colour with an outer surface of the metallic body 10.

In an embodiment of the present disclosure, after the metallic body 10 and the non-metallic layer 20 are polished and sandblasted, both outer surfaces of the metallic body 10 and the non-metallic layer 20 have good adhesive force to facilitate to apply ink on the outer surfaces of the metallic body 10 and the non-metallic layer 20. The ink is processed to form the coating layer 30. In order to protect the coating layer 30, an outer surface of the coating layer 30 is provided with an ink protecting layer 40. Specifically, firstly, as shown in FIG. 4, a layer of colouring ink 30a, including metal particles and pigments, is applied on outer surfaces of the metallic body 10 and the non-metallic layer 20, and the colouring ink 30a is solidified by heating the same at 70° C. for 20 min. Secondly, as shown in FIG. 5, protecting ink 40a is applied on the heated colouring ink 30a and heated to be solidified. Thirdly, as shown in FIG. 6, a film 40b, including a preset exposure area 40c coinciding with the non-metallic layer 20, is attached to the protecting ink 40a, and parts of the protecting ink 40a and the colouring ink 30a corresponding to the exposure area 40c are photopolymerized by irradiating the film 40b with a light source 40d, however, parts of the protecting ink 40a and the colouring ink 30a corresponding to the metallic body 10 are not reacted. Fourthly, as shown in FIG. 7, unreacted protecting ink 40a and unreacted colouring ink 30a are corroded by a sodium carbonate solution, leaving the protecting ink 40a and the colouring ink 30a corresponding to the exposure area 40c on the non-metallic layer 20. Lastly, the protecting ink 40a and the colouring ink 30a remaining on the non-metallic layer 20 is heated at 180° C. for solidification, and thus the protecting ink 40a remaining on the non-metallic layer 20 is formed as the ink protecting layer 40 and the colouring ink 30a remaining on the non-metallic layer 20 is formed as the coating layer 30.

At block S03: the outer surface of the metallic body 10 is subjected to a surface treatment to form an anodic oxidation layer 11 on the outer surface of the metallic body 10 (as shown in FIG. 8).

In an embodiment of the present disclosure, the outer surface of the metallic body 10 is subjected to the anodic oxidation treatment to form the anodic oxidation layer 11, thus colouring the outer surface of the metallic body 10 and allowing the outer surface of the metallic body 10 to exhibit a predetermined colour. In another embodiment of the present disclosure, if the metallic body 10 is not sandblasted before providing the coating layer 30 on the non-metallic layer 20, the anodic oxidation layer 11 needs to be sandblasted to further improve the appearance of the metallic body 10, and at the same time, the coating layer 30 and the ink protecting layer 40 provided on the non-metallic layer 20 are required to include the ink with sandblasting resistance.

Figure 13:
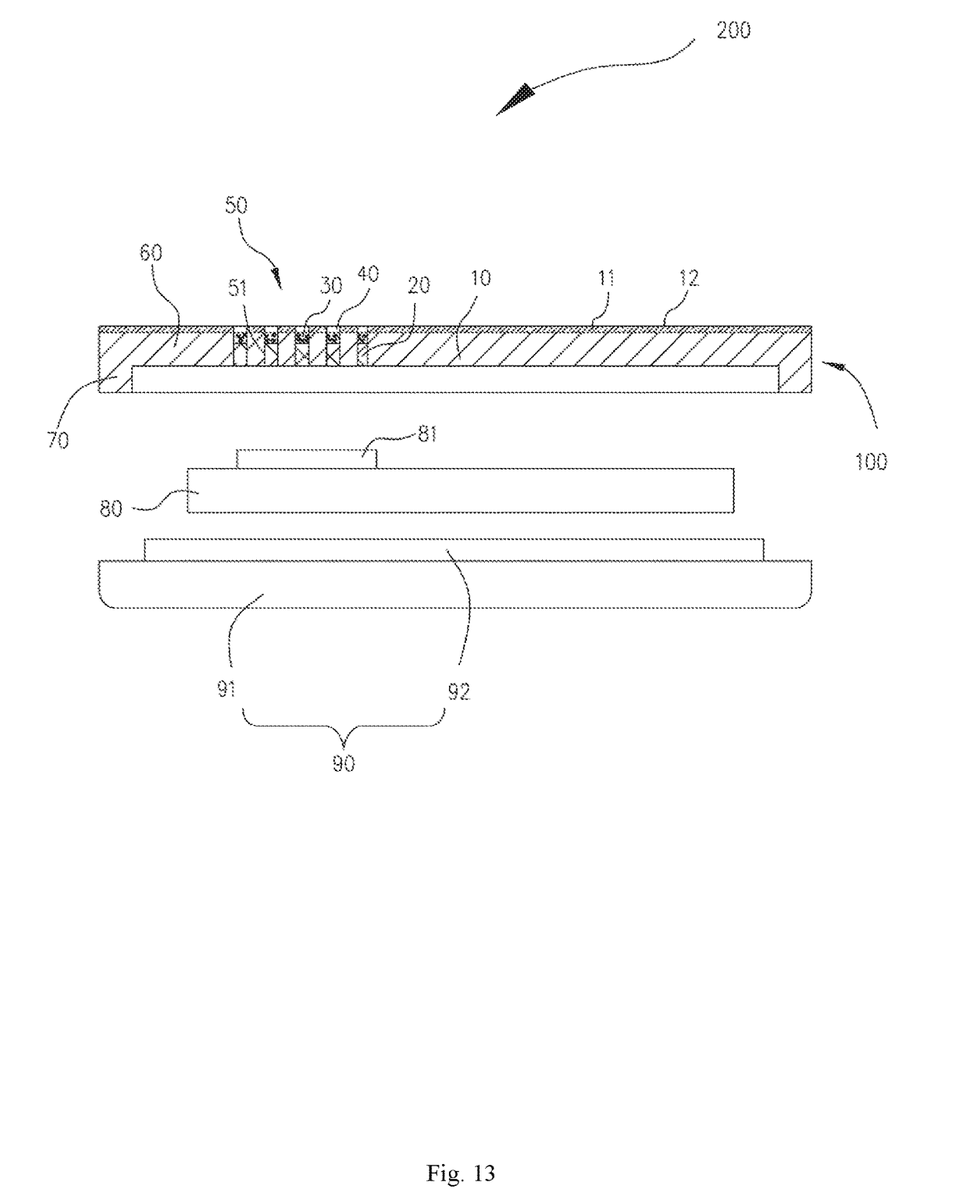
FIG. 13 is a schematic view of a mobile terminal according to an embodiment of the present disclosure.

As shown in FIG. 13, a mobile terminal 200 is provided in embodiments of the present disclosure. The mobile terminal 200 includes the shell 100, a mainboard 80 fixed in the shell 100, a functional component 81 disposed on the mainboard 80, and a front cover 90 fitted with the shell 100. It should be understood that, the functional component 81 may be an antenna, a battery or a central processing unit. The front cover 90 includes a transparent cover 91 and a display screen 92 fixed on the transparent cover 91. A peripheral edge of the front cover 90 is fixedly connected to a frame 70 of the shell 100, thus a housing of the mobile terminal 200 is formed by the front cover 90 and the shell 100 together.

With the shell, the method for manufacturing the shell and the mobile terminal including the shell according to embodiments of the present disclosure, the coating layer is provided on the outer surface of the non-metallic layer and exhibits a consistent colour with the outer surface of the metallic body, and thus the overall shell has a consistent appearance and the user experience is improved.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A shell, comprising:
   a metallic body,
   a non-metallic layer configured to connect at least two parts of the metallic body, and
   a coating layer only provided on an outer surface of the non-metallic layer, and exhibiting a consistent colour with an outer surface of the metallic body, wherein the coating layer comprises ink comprising metal particles and pigments.

2. The shell according to claim 1, the metal particles being at least one of aluminum, silver, iron, titanium, and an alloy thereof.

3. The shell according to claim 2, further comprising an ink protecting layer provided on the outer surface of the coating layer.

4. The shell according to claim 3, wherein the ink protecting layer comprises ink with sandblasting resistance; the ink in the coating layer being exposure ink and the ink protecting layer comprises exposure ink; an outer surface of the ink protecting layer being a matte surface.

5. The shell according to claim 3, wherein at least one of a plurality of the coating layers and a plurality of the ink protecting layers are laminated on the non-metallic layer.

6. The shell according to claim 1, wherein the non-metallic layer is configured to form a clearance area for an antenna; the non-metallic layer comprises a non-signal-shielding material, a material of the non-metallic layer being any one of plastics, carbon fiber, an organic resin and glass fiber.

7. The shell according to claim 1, wherein an anodic oxidation layer is provided on the outer surface of the metallic body, and exhibits a consistent colour with the coating layer.

8. The shell according to claim 7, wherein an outer surface of the anodic oxidation layer is a sandblasted surface, the anodic oxidation layer being formed integrally with the metallic body, the metallic body comprising a material selected from aluminum, silver, stainless steel, aluminium alloy, titanium alloy, magnesium alloy and magnalium alloy.

9. The shell according to claim 1, wherein the non-metallic layer and the metallic body are formed integrally.

10. The shell according to claim 1, wherein the non-metallic layer is formed as at least one ultra-fine strap of the shell, the at least one ultra-fine strap has a plurality of slots spaced apart from each other, the metallic body comprises at least two metal plates and a plurality of metal straps separated by the plurality of slots, a width of the slot being in a range of 0.2 mm to 3.0 mm.

11. The shell according to claim 1, wherein the shell comprises a back cover and a frame integrally formed with the back cover and formed at a bent peripheral edge of the back cover.

12. A mobile terminal, comprising
a shell comprising:
  a metallic body,
  a non-metallic layer configured to connect at least two parts of the metallic body, and
  a coating layer only provided on an outer surface of the non-metallic layer, and exhibiting a consistent colour with an outer surface of the metallic body, wherein the coating layer comprises ink comprising metal particles and pigments;
a mainboard fixed in the shell; and
a functional component disposed on the mainboard.

13. A shell, comprising:
a metallic body,
  a non-metallic layer configured to connect at least two parts of the metallic body, and
  a coating layer provided on an outer surface of the non-metallic layer, and exhibiting a consistent colour with an outer surface of the metallic body,
wherein the non-metallic layer is formed as at least one ultra-fine strap of the shell, the at least one ultra-fine strap has a plurality of slots spaced apart from each other, the metallic body comprises at least two metal plates and a plurality of metal straps separated by the plurality of slots, a width of the slot being in a range of 0.2 mm to 3.0 mm.

14. The shell according to claim 13, wherein the coating layer comprises ink comprising metal particles and pigments, the metal particle being at least one of aluminum, silver, iron, titanium, and an alloy thereof.

15. The shell according to claim 14, further comprising an ink protecting layer provided on the outer surface of the coating layer.

16. The shell according to claim 15, wherein the ink protecting layer comprises ink with sandblasting resistance; the ink in the coating layer being exposure ink and the ink protecting layer comprises exposure ink; an outer surface of the ink protecting layer being a matte surface.

17. The shell according to claim 15, wherein at least one of a plurality of the coating layers and a plurality of the ink protecting layers are laminated on the non-metallic layer.

18. The shell according to claim 13, wherein the non-metallic layer is configured to form a clearance area for an antenna; the non-metallic layer comprises a non-signal-shielding material, a material of the non-metallic layer being any one of plastics, carbon fiber, an organic resin and glass fiber.

19. The shell according to claim 13, wherein an anodic oxidation layer is provided on the outer surface of the metallic body, and exhibits a consistent colour with the coating layer.

20. The shell according to claim 19, wherein an outer surface of the anodic oxidation layer is a sandblasted surface, the anodic oxidation layer being formed integrally with the metallic body, the metallic body comprising a material selected from aluminum, silver, stainless steel, aluminium alloy, titanium alloy, magnesium alloy and magnalium alloy.

* * * * *